(12) United States Patent
Bhoraskar et al.

(10) Patent No.: US 10,771,074 B1
(45) Date of Patent: Sep. 8, 2020

(54) LOW POWER HIGH BANDWIDTH HIGH SPEED COMPARATOR

(71) Applicant: Analog Devices, Inc., Norwood, MA (US)

(72) Inventors: Paritosh Bhoraskar, Greensboro, NC (US); Ahmed Mohamed Abdelatty Ali, Oak Ridge, NC (US); Christopher Daniel Dillon, Greensboro, NC (US)

(73) Assignee: ANALOG DEVICES, INC., Norwood, MA (US)

( * ) Notice: Subject to any disclaimer, the term of this patent is extended or adjusted under 35 U.S.C. 154(b) by 0 days.

(21) Appl. No.: 16/283,194

(22) Filed: Feb. 22, 2019

(51) Int. Cl.
*H03M 1/12* (2006.01)
*H03M 1/00* (2006.01)
*H03M 1/08* (2006.01)
*H03M 1/80* (2006.01)
*H03M 1/10* (2006.01)

(52) U.S. Cl.
CPC ......... *H03M 1/002* (2013.01); *H03M 1/0845* (2013.01); *H03M 1/0872* (2013.01); *H03M 1/00* (2013.01); *H03M 1/10* (2013.01); *H03M 1/12* (2013.01); *H03M 1/802* (2013.01)

(58) Field of Classification Search
CPC .......... H03M 1/12; H03M 1/802; H03M 1/00; H03M 1/10
USPC ................................ 341/155, 172, 163, 120
See application file for complete search history.

(56) References Cited

U.S. PATENT DOCUMENTS

| | | | |
|---|---|---|---|
| 9,490,832 B1* | 11/2016 | Zhou | H03M 1/0872 |
| 2006/0176988 A1* | 8/2006 | Sohn | H04L 7/0058 |
| | | | 375/348 |

FOREIGN PATENT DOCUMENTS

| | | |
|---|---|---|
| CN | 201854264 | 6/2011 |
| CN | 105680834 | 6/2016 |

OTHER PUBLICATIONS

Savani et al., *Implementation of Low Power Rail-To-Rail Dynamic Latch Comparator with Modified Adaptive Power Control Technique*, NIRMA University Journal of Engineering and Technology vol. 5, No. 2, Jul.-Dec. 2016, 7 pages.
Joshi et al., *Analysis and Design of a Low-Voltage Low-Power Double-Tail Comparator*, International Journal of VLSI System Design and Communication Systems, ISSN 2322-0929, vol. 04, Issue 03, Mar. 2016, 4 pages.
Amaral et al., *An Improved Low-Voltage Low-Power CMOS Comparator to be used in High-Speed Pipeline ADCs*, 0-7803-7448-7/02 © 2002 IEEE, 4 pages.
Min et al., *A 69-mW 10-bit 80-MSample/s Pipelined CMOS ADC*, IEEE Journal of Solid-State Circuits, vol. 38, No. 12, Dec. 2003, 9 pages.

(Continued)

*Primary Examiner* — Joseph J Lauture
(74) *Attorney, Agent, or Firm* — Patent Capital Group

(57) ABSTRACT

Comparators are implemented in many circuits, including analog-to-digital converters (ADCs). Some ADCs demand high bandwidth, low power consumption, and high speed. To address these requirements, a comparator circuit can be implemented without a separate pre-amplifier, where a sampling network drives a latch directly. Specifically, the comparator circuit integrates a pre-amplifier within the latch in a manner that ensures low power and high speed operation.

20 Claims, 11 Drawing Sheets

(56) References Cited

OTHER PUBLICATIONS

Guermaz et al., *High Speed Low Power CMOS Comparator for Pipeline ADCs*, Proc. 25th International Conference on Microelectronics (MIEL 2006), Belgrade, Servia and Montenegro, May 14-17, 2006, 4 pages.

Oliveira et al., *Low-Power CMOS Comparator with Embedded Amplification for Ultra-high-speed ADCs*, 1-4244-0921-7/07 © 2007 IEEE, 4 pages.

Miyahara et al., *A Low-Noise Self-Calibrating Dynamic Comparator for High-Speed ADCs*, IEEE Asian Solid-State Circuits Conference, Nov. 3-5, 2008, Fukuoka, Japan, 4 pages.

Park et al., *A 10b 100MS/s 25.2mW 0.18μm CMOS ADC with Various Circuit Sharing Techniques*, 978-1-4244-5035-0/09 © 2009 IEEE, 4 pages.

Gao et al., *Low Voltage Comparator for High Speed ADC*, Proceedings of International Symposium on Signals, Systems and Electronics (ISSSE2010), 978-1-4244-6355-8/10 © 2010 IEEE, 4 pages.

Muratore et al., *Very High-Speed CMOS Comparators for multi-GS/s A/D Converters*, 978-1-4799-8229-5/151 © 2015 IEEE, 4 pages.

Ali et al., *A 14 Bit 1 GS/s RF Sampling Pipelined ADC with Background Calibration*, IEEE Journal of Solid-State Circuits, vol. 49, No. 12, Dec. 2014, 11 pages.

Baradaranrezaeii et al., *An ultra high-speed high-resolution low-offset low-power voltage comparator with a reliable offset cancellation method for high-performance applications in 0.18 μm CMOS technology*, Analog Integr Circ Sig Process (2015) 85:181-192, 12 pages.

Razavi, *The StrongARM Latch*, IEEE Solid-State Circuits Magazine, Spring 2015, 6 pages.

English Translation of Foreign Reference, CN105680834 (see 1 above), 19 pages.

English Translation of Foreign Reference, CN201854264 (see 2 above), 11 pages.

Jayachandran et al., *Design of Low Voltage Comparator for Analog to Digital Conversion*, International Journal of Advanced Research in Electrical, Electronics and Instrumentation Engineering, vol. 3, Issue 12, Dec. 2014, 7 pages.

Guermaz et al., *High-speed low-power CMOS comparator dedicated to 10 bit 20 MHz pipeline ADCs for RF WLAN applications*, International Journal of Electronics, 2008, 11 pages.

Sathishkumar et al., *Analysis and Design of Low Power High Speed Dynamic Latch Comparator using CMOS Process*, International Journal of Scientific & Engineering Research, vol. 5, Issue 5, May 2014, 6 pages.

Joy et al., *Design and Analysis of Lower Power Comparator Using Switching Transistor*, IOSR Journal of VLSI and Signal Processing, vol. 4, Issue 2, Ver. III, Mar.-Apr. 2014, 6 pages.

*Lecture 410—High-Speed Comparators*, ECE 6412—Analog Integrated Circuit Design—II, 2002, 5 pages.

Lee et al., *Ten-bit 100 MS/s 24.2 mW 0.8 mm2 0.18μm CMOS pipeline ADC based on maximal circuit sharing schemes*, Electronic Letters, Dec. 3, 2009, vol. 45, No. 25, 3 pages.

Xingyuan et al., *An offset cancellation technique in a switched-capacitor comparator for SAR ADCs*, Journal of Semiconductors, 2012, 6 pages.

\* cited by examiner

_US 10,771,074 B1_

LOW POWER HIGH BANDWIDTH HIGH SPEED COMPARATOR

TECHNICAL FIELD OF THE DISCLOSURE

The present disclosure relates to the field of integrated circuits, in particular to comparator circuits.

BACKGROUND

In many electronics applications, an analog-to-digital converter (ADC) converts an analog input signal to a digital output signal, e.g., for further digital signal processing or storage by digital electronics. Broadly speaking, ADCs can translate analog electrical signals representing real-world phenomenon, e.g., light, sound, temperature, electromagnetic waves, or pressure for data processing purposes. For instance, in measurement systems, a sensor makes measurements and generates an analog signal. The analog signal would then be provided to an ADC as input to generate a digital output signal for further processing. In another instance, a transmitter generates an analog signal using electromagnetic waves to carry information in the air or a transmitter transmits an analog signal to carry information over a cable. The analog signal is then provided as input to an ADC at a receiver to generate a digital output signal, e.g., for further processing by digital electronics.

Due to their wide applicability in many applications, ADCs can be found in places such as broadband communication systems, audio systems, receiver systems, etc. Designing circuitry in ADC is a non-trivial task because each application may have different needs in performance, power, cost, and size. ADCs are used in a broad range of applications including Communications, Energy, Healthcare, Instrumentation and Measurement, Motor and Power Control, Industrial Automation and Aerospace/Defense. As the number of applications needing ADCs grow, the need for fast, low power, and accurate conversion also grows.

BRIEF DESCRIPTION OF THE DRAWINGS

To provide a more complete understanding of the present disclosure and features and advantages thereof, reference is made to the following description, taken in conjunction with the accompanying figures, wherein like reference numerals represent like parts, in which.

DETAILED DESCRIPTION

Overview

Figure 1:
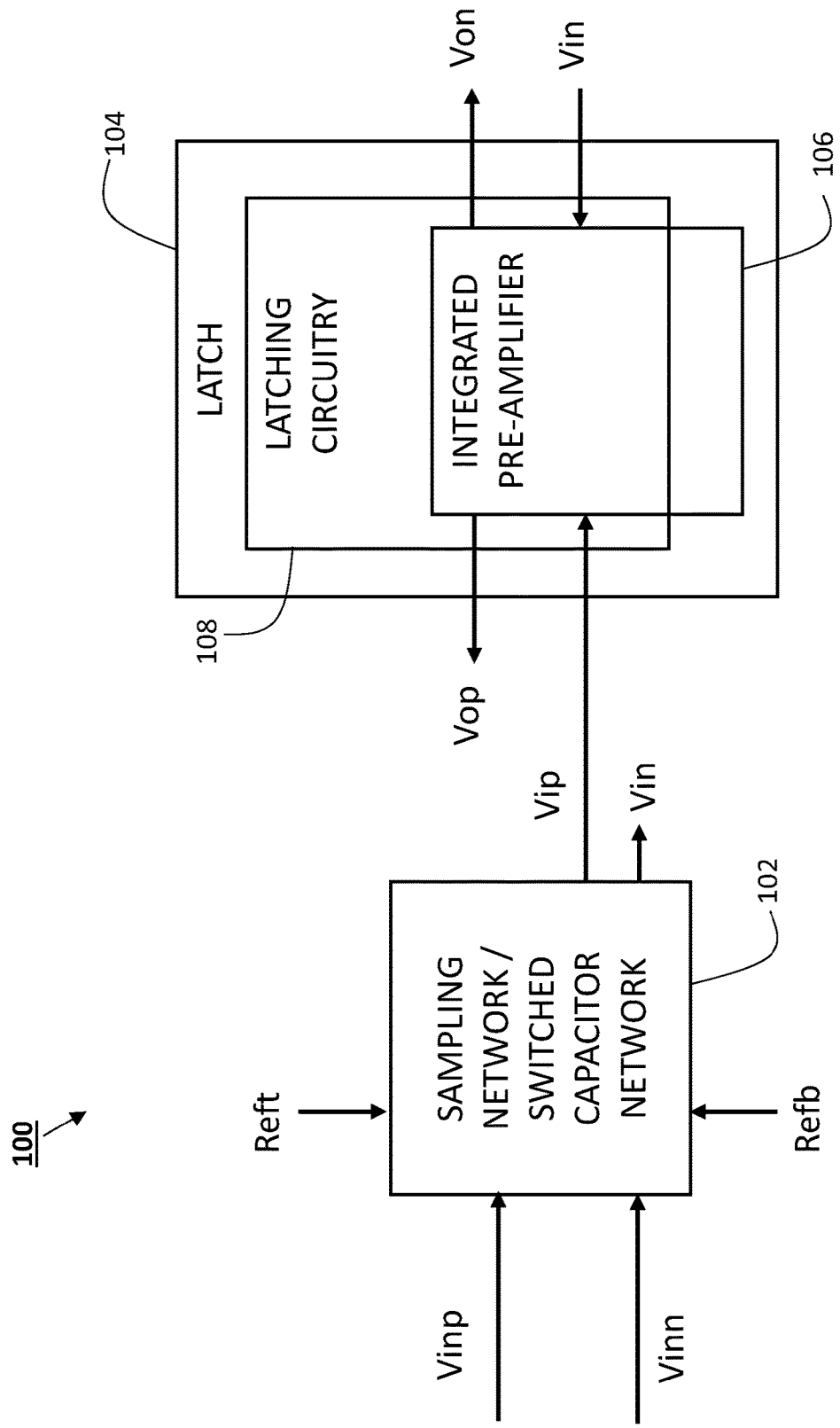
FIG. 1 illustrates a circuit architecture of a comparator, according to some embodiments of the disclosure.

Comparators are implemented in many circuits, including analog-to-digital converters (ADCs). Some ADCs demand high bandwidth, low power consumption, and high speed. To address these requirements, a comparator circuit can be implemented without a separate pre-amplifier, where a sampling network drives a latch directly. Specifically, the comparator circuit integrates a pre-amplifier within the latch in a manner that ensures low power and high speed operation.

Design Challenges for Comparators

Many markets are demanding higher speed ADCs. In some high speed ADC architectures, such as pipeline ADCs, comparators acquire the analog input signal and performs coarse quantization (e.g., a bank of comparators often form a flash ADC to perform coarse quantization). Speed of acquisition and latching of comparison result can affect the overall speed of an ADC. Therefore, much design effort is spent to make sure the comparators can acquire the analog input signal and latch a comparison result at high speeds.

To achieve even higher speeds, designers have been time-interleaving slower ADCs. The slower ADCs, referred to as slices, sample an analog input in a time-interleaved manner, one after another, and performs conversion of the analog input in parallel. Even though each slice can operate at a slower speed, the slice still needs to sample and acquire the analog input quickly, independent of the speed of the slice. In some Gigahertz interleaved converters, the acquire phase (i.e., time allowed for acquiring the analog input signal) for a slice can be in the order of a few to tens of picoseconds. At the same time, interleaving can be more efficient with faster slices, which means that the speed of latching of the comparison result can't be compromised. Another challenge to designing comparators used in time-interleaved slices is that the number of comparators increases as the number of slices increases. Power consumption can be a limiting factor in the design when many comparators are needed to implement the slices for interleaving.

Low Power High Bandwidth Comparator Design and Benefits

In general, a comparator can compare an input signal against a reference (or reference signal), and output a signal that indicates whether the input signal is larger or smaller than the reference. The comparator can derive a difference between the input signal and the reference to determine whether the input signal is larger or smaller than the reference. Often, the comparator would output a logical "1" or "high" signal if the input signal is larger than the reference, and the comparator would output a logic "0" or "low" signal if the input signal is smaller than the reference. In some cases, a comparator is latched (or clocked) to output the signal when strobed by a clock signal. Such a comparator is often referred to as a dynamic comparator. A regenerative latch can provide positive feedback, during a regeneration phase, to generate the output signal quickly in response to the clock signal.

A comparator can be implemented with improved circuit topologies to increase the speed of signal acquisition, increase acquire bandwidth, improve the speed of latching, and reduce power consumption.

Various comparators illustrated by the disclosure has three phases of operation: reset phase, acquire phase, and regeneration ("regen") phase. During the reset phase, the comparator is reset. During the acquire phase, the comparator acquires the input signal and compares the input signal and the reference signal. In some contexts, such as time-interleaved ADCs, this acquire phase can be very short. During the regeneration phase, the comparator latches a result of the comparison of the input signal and the reference and generates an output at the output nodes of the comparator. The comparator can return to reset phase after the regeneration phase is complete.

One improvement is the integration of a pre-amplifier within a latch. Avoiding the need to provide a discrete/separate pre-amplifier can improve the acquire bandwidth, reduce total power consumption, and reduce circuit area. An integrated pre-amplifier can also set the current in the comparator during the acquire phase, which can further allow power consumption to be controlled more effectively by ensuring only a very small static current is burned by the comparator.

Another improvement is capacitive level-shifting in the latch. Capacitors in the latch can decouple p and n sides in the latch to allow the gate-to-source voltages of the p and n sides of the latch to be set separately and optimized for better speed.

These two improvements effectively allow a difference between the input signal and the reference to drive the latch directly at regeneration nodes of the latch during the acquire phase, and the difference is retained on gates of transistors in the latch when the regeneration phase begins. The resulting latch can regenerate very quickly.

Details of these improvements and other additional improvements are illustrated by the following description and figures. Differential implementations are illustrated.

Circuit Architecture: Integrated Pre-Amplifier

FIG. 1 illustrates a circuit architecture of a comparator 100, according to some embodiments of the disclosure. The comparator 100 can be a low power and high bandwidth comparator. The comparator 100 can include a switched capacitor network 102, and a latch 104. The switched capacitor network 102 can be referred to as a sampling network, as well.

The switched capacitor network 102 can receive and sample an input signal (e.g., signals at input nodes Vinp and Vinn). The switched capacitor network 102 can derive a difference between the input signal and a reference (e.g., Reft and Refb). The difference can be provided to the latch 104 as differential signals at nodes Vip and Vin.

The latch 104 can have an integrated pre-amplifier 106, latching circuitry 108, and output nodes (e.g., Vop and Von). Some circuitry in the integrated pre-amplifier 106 also serves as part of the latching circuitry 108. The integrated pre-amplifier 106 and the latching circuitry 108 share the output nodes (e.g., Vop and Von). Phrased differently, both circuitry in the integrated pre-amplifier 106 and circuitry in the latching circuitry 108 are coupled to the output nodes. The integrated pre-amplifier 106 can have transistor devices which are at the output nodes, and the latching circuitry 108 can have transistor devices which are at the output nodes. The overlap of the integrated pre-amplifier 106 and latching circuitry 108 shown in the FIGURE means that there is circuitry which serving as part of the integrated pre-amplifier 106 and also as a part of the latching circuitry 108. For example, transistor devices in the latch 104 can be used both for amplification in the integrated pre-amplifier 106 and for regeneration in the latching circuitry 108. The circuitry in the integrated pre-amplifier 106 and circuitry in the latching circuitry 108 cooperate to generate the output signal of the comparator 100 at the output nodes (e.g., Vop and Von).

The difference provided as differential signals at nodes Vip and Vin can (directly) drive the integrated pre-amplifier 106 during an acquire phase of the latch 104. Specifically, the differential signals at nodes Vip and Vin can (directly) drive gates of transistor devices in the integrated pre-amplifier 106.

In some conventional implementations, the pre-amplifier is not at the output nodes. One would see that the pre-amplifier is separate from the latching circuitry. The pre-amplifier generates a signal which is then used to drives the latching circuitry, but no part of the pre-amplifier would perform the latching and/or regeneration functionalities. For some conventional implementations, the latch is stacked on top of the pre-amplifier, which adds an additional transistor device in the stack. Moreover, the pre-amplifier that is stacked with the latch is not at the output nodes. The stacked pre-amplifier would be separated from the output nodes by devices in the latch. In other words, devices in the latch, and not devices in the stacked pre-amplifier would be at the output nodes and generating an output of the comparator at the output nodes. Furthermore, the stacked pre-amplifier would not generate signals to drive gates of transistor devices in the latch.

Exemplary Circuit Implementation and Circuit Topology

Figure 2:
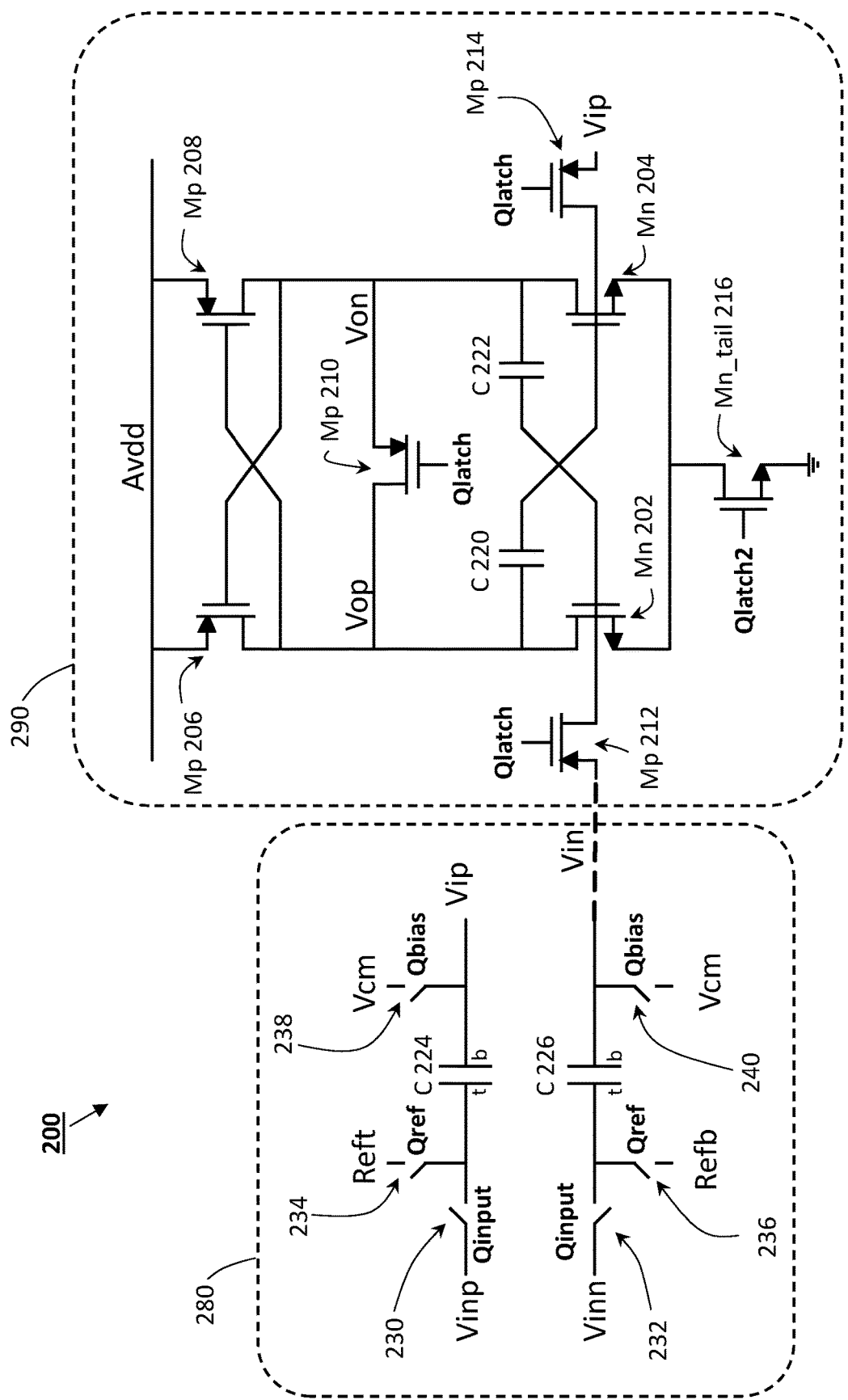
FIG. 2 shows an exemplary circuit implementation of a comparator, according to some embodiments of a disclosure.
Figure 3:
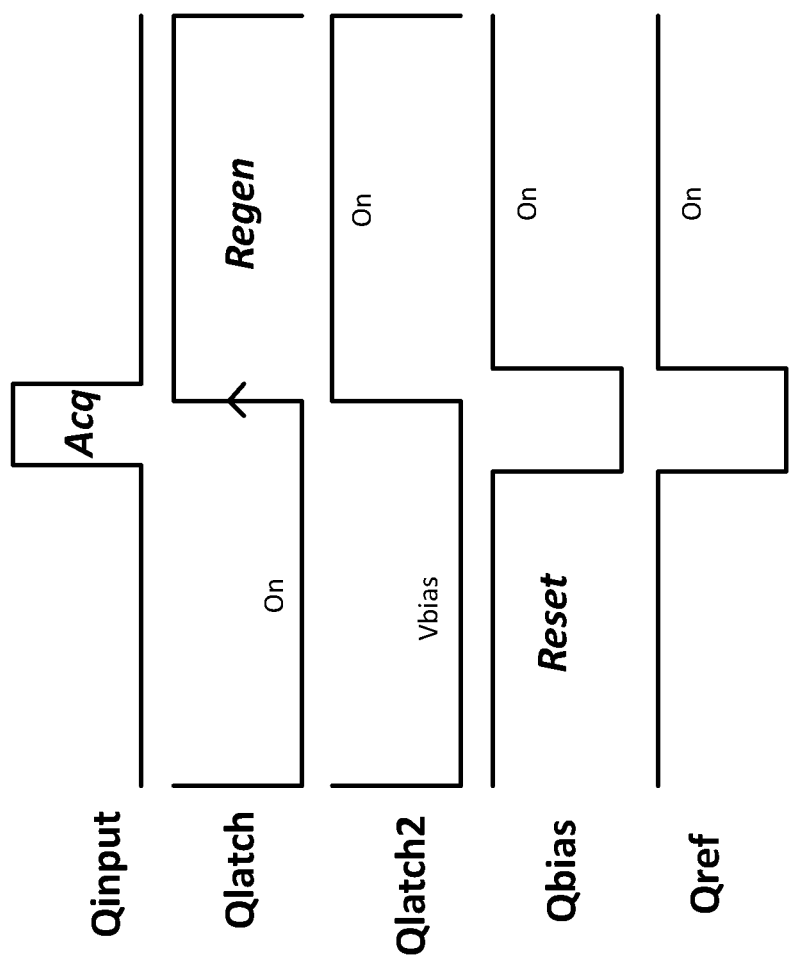
FIG. 3 shows an exemplary timing diagram of control signals controlling switches seen in FIG. 2, according to some embodiments of the disclosure.

FIG. 2 shows an exemplary circuit implementation of a comparator 200, according to some embodiments of a disclosure. The circuit implementation seen in FIG. 2 illustrates an exemplary implementation of the circuit architecture of FIG. 1. A differential implementation is shown in FIG. 2. A differential input signal can be provided at input nodes Vinp and Vinn. A differential output signal can be generated at output nodes Vop and Von. FIG. 3 shows an exemplary timing diagram of control signals controlling switches seen in FIG. 2, according to some embodiments of the disclosure. Switches and/or transistor devices in the comparator 200 are controlled/biased by various control signals to implement the three phases of operation, as illustrated by the timing diagram of the various control signals in FIG. 2. The following passages describe the circuit implementation and topology. Subsequent sections of the disclosure describe the phases of operation in greater detail.

The comparator 200 can be a low power and high bandwidth comparator. The The comparator 200 has a sampling network 280 and a latch 290. The sampling network 280 is an example of the switched capacitor network 102 of FIG. 1. The latch 290 is an example of the latch 104 of FIG. 1, and the latch 290 has an integrated pre-amplifier, latching circuitry, and output nodes. The following passages describe the exemplary transistor level circuitry that makes up the parts seen in FIG. 1.

Referring back to FIG. 2, comparator 200 has a sampling network 280 to derive a difference between the input signal (i.e., signals at input nodes Vinp and Vinn) and a reference (e.g., Reft and Refb). The sampling network 280 performs comparison of the input signal and the reference. The sampling network 280 can include switches and capacitors (e.g., C 224 and C 226) to sample the reference (e.g., Reft and Refb) onto the capacitors, and connect the capacitors to the input (e.g., nodes Vinp and Vinn) to derive the difference (at nodes Vip and Vin).

In the implementation shown, the sampling network 280 has input switches 230 and 232 (controlled by control signal Qinput), reference switches 234 and 236 (controlled by control signal Qref), and common mode switches (controlled by control signal Qbias). Input switch 230 connects a first/top plate of capacitor C 224 to input node Vinp, when the control signal Qinput closes the input switch 230. Input switch 232 connects a first/top plate of capacitor C 226 to input node Vinp, when the control signal Qinput closes the input switch 230. Reference switch 234 connects the first/top plate of capacitor C 224 to a first reference voltage Reft, when the control signal Qref closes the reference switch 234. Reference switch 236 connects the first/top plate of capacitor C 226 to a second reference voltage Refb, when the control signal Qref closes the reference switch 236. Common mode switch 238 connects the second/bottom plate of capacitor C 224 to a common mode voltage Vcm, when the control signal Qbias closes the common mode switch 238. Common mode switch 240 connects the second/bottom plate of capacitor C 226 to the common mode voltage Vcm, when the control signal Qbias closes the common mode switch 240.

The comparator 200 further includes a latch 290. Latch 290 latches the difference from the sampling network 280 and generates a final output of the comparator 200 at output nodes Vop and Von.

The latch 290 has a first cross-coupled pair of transistors, Mn 202 and Mn 204. The latch 290 has output nodes Vop and Von, which are at respective first terminals of the first cross-coupled pair of transistors, e.g., drains of Mn 202 and Mn 204. Drain of Mn 202 is at output node Vop, and drain of Mn 202 is at output node Von. Mn 202 and Mn 204 are shown as N-type/n-channel metal-oxide semiconductor field-effect transistors (NMOS transistors). In this example, the second terminals of the first cross-coupled pair of transistors, e.g., sources of Mn 202 and Mn 204, are connected together.

The gates of the first cross-coupled pair of transistors, Mn 202 and Mn 204, are cross-coupled to the output nodes Vop and Von. Specifically, the gates of the first cross-coupled pair of transistors, Mn 202 and Mn 204, are cross-coupled to the output nodes, Vop and Von, via respective level-shifting capacitors, C 220 and C 222. Gate of Mn 202 is (capacitively) coupled to output node Von via level-shifting capacitor C 222. Gate of Mn 204 is (capacitively) coupled the output node Vop via level-shifting capacitor C 220.

The latch 290 can include a tail current transistor, Mn_tail 216. The tail current transistor is coupled to at least one of the second terminals, i.e., sources, of the first cross-coupled pair of transistors, Mn 202 and Mn 204. In this example, the sources of the first cross-coupled pair of transistors, Mn 202 and Mn 204, are connected together, and the drain of the tail current transistor, Mn_tail 216, is connected to the sources of the first cross-coupled pair of transistors, Mn 202 and Mn 204. The source of the tail current transistor, Mn_tail 216 is connected to ground. The gate of the tail current transistor, Mn_tail 216, is controlled/biased by control signal Qlatch2. Tail current transistor, Mn_tail 216, is shown an NMOS transistor (e.g., same type as the first cross-coupled pair of transistors).

The first cross-coupled pair of transistors, Mn 202 and Mn 204, have gates which are directly driven by the difference from the sampling network 280. The latch 290 includes isolation switches, Mp 212 and Mp 214, which are controlled by control signal Qlatch. Isolation switches, Mp 212 and Mp 214, serve to separate the sampling network 280 from the latch 290 when the latch 290 is regenerating, and to control when the difference is directly driving the latch 290. The isolation switches can couple/connect/provide the difference from the sampling network 280 to the respective gates of the first cross-coupled pair of transistors, Mn 202 and Mn 204. Specifically, isolation switches, Mp 212 and Mp 214, when closed, takes the difference generated by the sampling network 280 on nodes, Vip and Vin, and provide the difference to the gates of first cross-coupled pair of transistors, Mn 202 and Mn 204. Effectively, the isolation switches, Mp 212 and Mp 214, when turned "on", couple nodes, Vip and Vin, to the respective gates of the first cross-coupled pair of transistors, Mn 202 and Mn 204, and drives the gates of the first cross-coupled pair of transistors, Mn 202 and Mn 204, with the difference generated by the sampling network 280. Isolation switches, Mp 212 and Mp 214, are shown as P-type/p-channel metal-oxide semiconductor field-effect transistors (PMOS transistors), whose gates are driven by the control signal Qlatch. However, the switching functionality of the isolation switches, Mp 212 and Mp 214, can also be implemented with NMOS transistors or transmission gates (a transmission gate has an NMOS and PMOS transistor in parallel), and a suitable control signal to drive the NMOS transistors or the transmission gates. In some cases, the isolation switches, Mp 212 and Mp 214, can be considered part of the sampling network 280. While there is an isolation switch that separates the sampling network 280 and the first cross-coupled pair of transistors, Mn 202 and Mn 204, the isolation switches, Mp 212 and Mp 214, do not perform amplification, and merely couples the nodes, Vin and Vip, to the respective gates of first cross-coupled pair of transistors, Mn 202 and Mn 204. This means that there is no discrete, separate pre-amplifier driving the gates of the first cross-coupled pair of transistors, Mn 202 and Mn 204.

The latch 290 also has a second cross-coupled pair of transistors Mp 206 and Mp 208. First terminals of second cross-coupled pair of transistors Mp 206 and Mp 208, e.g., drains of Mp 206 and Mp 208, are at the respective output nodes Vop and Von. Drain of Mp 206 is at the output node Vop, and drain of Mp 208 is at the output node Von. Second terminals of second cross-coupled pair of transistors Mp 206 and Mp 208, e.g., drains of Mp 206 and Mp 208, are connected to the supply Avdd. Gates of the second cross-coupled pair of transistors, Mp 206 and Mp 208, are cross-coupled to the output nodes Vop and Von. Gate of Mp 206 is connected to the output node Von, and gate of Mp 208 is connected to the output node Vop. Mp 206 and Mp 208 are shown as PMOS transistors (e.g., a second type different from the first cross-coupled pair of transistors).

The latch 290 can include one or more latching switches. In the example shown, the latch 290 has a latching switch, Mp 210, coupled across the output nodes, Vop and Von. When closed, the latching switch, Mp 210, connects the output nodes together. When opened, the latching switch, Mp 210, decouples the output nodes and lets the latch 290 regenerate. Mp 210 is controlled by control signal Qlatch. Mp 210 is shown as a PMOS transistor. However, the switching functionality of the latching switches illustrated herein can also be implemented with NMOS transistors or transmission gates, and a suitable control signal to drive the NMOS transistors or the transmission gates.

Referring to both FIGS. 1 and 2, the integrated pre-amplifier 106 of FIG. 1 can include the first cross-coupled pair of transistors, e.g., Mn 202 and Mn 204, and the tail current transistor, e.g., Mn_tail 216, of FIG. 2. The output nodes, Vop and Von, are at respective first terminals (drains) of the first cross-coupled pair of transistors, e.g., Mn 202 and Mn 204. The difference from the switched capacitor network 102 drives gates of the first cross-coupled pair of transistors, e.g., Mn 202 and Mn 204, during the acquire phase of the latch 104 and the latch 290. The tail current transistor, e.g., Mn_tail 216, can set a current in the latch 104 and the latch 290 during the acquire phase of the latch 104 and the latch 290. The latching circuitry 108 of FIG. 1 can include the first cross-coupled pair of transistors, e.g., Mn 202 and Mn 204, and the second cross-coupled pair of transistors of a second type different from the first type, e.g., Mp 206 and Mp 208, and a latching switch coupled across the output nodes, e.g., Mp 210, of FIG. 2. The output nodes, Vop and Von, are at respective first terminals (drains) of the second cross-coupled pair of transistors, e.g., Mp 206 and Mp 208, and are cross-coupled to gates of the second cross-coupled pair of transistors, e.g., Mp 206 and Mp 208.

Notably, the first cross-coupled pair of transistors, e.g., Mn 202 and Mn 204, is a part of the integrated pre-amplifier 106 and the latching circuitry 108 of FIG. 1. In some conventional approaches, the latch stacks a latch on top of a pre-amplifier. A stacked topology leads to an extra transistor device in the stack, which can limit the speed of the latch. Having an extra transistor device in the stack also takes up headroom. With the use of the level-shifting capacitors, C 220 and 222 in the latch 290, the first cross-coupled pair of transistors, e.g., Mn 202 and Mn 204, are used both as a differential pair of transistors in the integrated pre-amplifier 106, and for regeneration in the latching circuitry 108. The difference from the switched capacitor network 102 is (directly) sampled on the gates of the first cross-coupled pair of transistors, e.g., Mn 202 and Mn 204, as well, and the first cross-coupled pair of transistors, e.g., Mn 202 and Mn 204 (serving as part of both the integrated pre-amplifier 106 and latching circuitry 108), can regenerate faster than the conventional approaches.

The first cross-coupled pair of transistors, Mn 202 and Mn 204, are of a first type and the second cross-coupled pair of transistors, Mp 206 and Mp 208, are of a second type different from the first type. For instance, if the first cross-coupled pair of transistors, Mn 202 and Mn 204, are NMOS transistors, then the second cross-coupled pair of transistors, Mp 206 and Mp 208 are PMOS transistors. Alternatively, if the first cross-coupled pair of transistors, Mn 202 and Mn 204, are PMOS transistors, then the second cross-coupled pair of transistors, Mp 206 and Mp 208 are NMOS transistors.

Capacitive Decoupling of the P and N Sides of the Latch

Advantageously, the level-shifting capacitors, C 220 and C 222 in FIG. 2 decouple the gate-to-source voltage (Vgs) of the NMOS and PMOS devices, i.e., first cross-coupled pair of transistors, Mn 202 and Mn 204, and the second cross-coupled pair of transistors, Mp 206 and Mp 208. The decoupling of Vgs of the NMOS and PMOS devices in the latch 290 allows the Vgs of the NMOS and PMOS devices to be set and optimized separately and independently to improve the speed of the latch 290. For instance, less propagation delay and faster regeneration time can be achieved.

Reset Phase

Referring to the comparator 200 in FIG. 2 and timing diagram seen in FIG. 3, during reset phase:

Qinput is "low", which means that input switches 230 and 232 are open.

Qlatch is "low", which means that isolation switches, Mp 212 and Mp 214, and latching switch Mp 210 are closed (switches are implemented with PMOS transistors).

Qlatch2 is at a bias voltage Vbias to control/bias the tail current transistor Mn_tail 216 and set a current through the tail current transistor Mn_tail 216.

Qbias is "high", which means that common mode switches 238 and 240 are closed.

Qref is "high", which means that the reference switches 234 and 236 are closed.

During the reset phase, the sampling network 280 first samples the reference onto the capacitors, C 224 and C 226, Specifically, the control signal Qref is "high" and the control signal Qbias is "high" to connect the first/top plates of the capacitors, C 224 and C 226, to the first and second reference voltages, Reft and Refb, and the second/bottom plates of the capacitors, C 224 and C 226, to the common mode voltage to sample the reference onto the capacitors, C 224 and C 226.

Also during the reset phase, the latch resets the output nodes to a common mode voltage (e.g., Vcm). For instance, the control signals Qbias and Qlatch overlap to turn their corresponding transistor devices on (or closes their corresponding switches) before the acquire phase start. When common mode switches 238 and 240 and isolation switches, Mp 212 and Mp 214, are closed, the common mode voltage Vcm is provided to the gates of the first cross-coupled pair of transistors, Mn 202 and Mn 204. When the latching switch Mp 210 closes, the output nodes, Vop and Von, and level-shifting capacitors, C 220 and C 222, reset and settle to a common mode voltage (which can be different from Vcm). Specifically, the latch resets by connecting gates of the first cross-coupled pair of transistors, Mn 202 and Mn 204, to a common mode voltage Vcm. The latch resets further by connecting the output nodes, Vop and Von, together, which also connects the first terminals (e.g., drains) of the first cross-coupled pair of transistors Mn 202 and Mn 204 together. As a result, the output nodes Vop and Von are reset to a common mode voltage (which can be different from Vcm) so that there is no longer any latched result in the latch 290.

Also, during the reset phase, Qlatch2 is at a bias voltage Vbias to bias the tail current transistor, Mn_tail 216. The tail current transistor, Mn_tail 216, sets a current in the latch, and keeps the latch "alive". By keeping the latch 290 "alive", the latch is "ready to go" when the latch 2900 transitions to acquire and regeneration phases, and can operate faster than conventional approaches that do not keep any current in the latch before regeneration phase.

Notably, resetting the output nodes to a common mode voltage is different from conventional approaches which reset to a supply voltage. Resetting to a supply voltage means that the output nodes has to move from the supply voltage during regeneration and can hurt propagation delay. When the output nodes, Vop and Von, are reset to a common mode voltage (which can be different from Vcm) and a current is set in the latch prior to regeneration phase, the second cross-coupled pair of transistors, Mp 206 and Mp 208, is "ready to go" as the latch is released during regeneration phase. Therefore, the latch 290 can regenerate faster with less propagation delay than conventional approaches.

Acquire Phase

Referring to the comparator 200 in FIG. 2 and timing diagram seen in FIG. 3, during acquire phase:

Qinput is "high", which means that input switches 230 and 232 are closed.

Qlatch is "low", which means that isolation switches, Mp 212 and Mp 214, and latching switch Mp 210 are closed (switches are implemented with PMOS transistors).

Qlatch2 is at a bias voltage Vbias to control/bias the tail current transistor Mn_tail 216 and set a current through the tail current transistor Mn_tail 216.

Qbias is "low", which means that common mode switches 238 and 240 are open.

Qref is "low", which means that the reference switches 234 and 236 are open.

During the acquire phase, the input signal is compared against the reference. Specifically, the capacitors, C 224 and C 226 are connected to the input nodes, Vinp and Vinn, to implement subtraction/comparison of the input signal and the reference. After sampling the reference onto the capacitors, C 224 and C 226, the control signal Qref is "low", the control signal "Qinput" is "high", and the control signal "Qbias" is "low". As a result, the first/top plates of the capacitors, C 224 and C 226, are connected to respective input nodes, Vinp and Vinn, and the second/bottom plates of capacitors, C 224 and C 226, are disconnected from the common mode voltage Vcm. Connecting the capacitors to the input nodes causes voltages at the nodes, Vip and Vin, to move up or down from the common mode voltage depending on whether the input signal is greater than or less than the reference. As a result, the resulting voltages at the nodes, Vip and Vin, is representative of a comparison result or difference between the input signal and the reference. For example, Vip and Vin may have a positive signal if the input signal is greater than the reference, and Vip and Vin may have a negative signal if the input signal is less than the reference. By using the same capacitor to sample the reference and to connect to the input, the sampling network 280 does not suffer from charge redistribution time between multiple capacitors that is typically present in charge distribution comparators.

Also, during the acquire phase, latch 290 performs pre-amplification, where latch 290 acquires and amplifies the difference at the gates of the first cross-coupled pair of transistors, Mn 202 and Mn 204. With Qlatch being "low", isolation switches, Mp 212 and Mp 214, are closed to provide the difference to the gates of Mn 202 and Mn 204. The latching switch, Mp 210, is biased to turn on, connecting the output nodes, Vop and Von, together. Qlatch2 is at a bias voltage Vbias to bias the tail current transistor, Mn_tail 216. The first cross-coupled pair of transistors, Mn 202 and Mn 204, acts as a differential pair of transistors, and the tail current transistor, Mn_tail 216, acts as a current source. Mn 202, Mn 204, and Mn_tail 216 effectively form a differential amplifier to perform pre-amplification of the difference at nodes Vip and Vin prior to regeneration in the latch 290. As a result, latch 290 does not need a separate pre-amplifier. Eliminating a separate pre-amplifier can save area and overall power consumption of the comparator 200. In some cases, the lack of a pre-amplifier can improve offset since some pre-amplifiers can hurt/amplify offset that comes from the latch 290, and there are fewer devices which can contribute to offsets in the comparator 200.

Again, Mn_tail 216, is biased to set a current in the latch during the acquire phase, and keeps the latch "alive". Setting the current can make sure the latch 290 burns a very small amount of static current during reset and acquire phases and help maintain low power consumption in the latch 290. Moreover, Mn_tail 216 provides current in the first cross-coupled pair of transistors, Mn 202 and Mn 204. The difference driving the gates of the first cross-coupled pair of transistors, Mn 202 and Mn 204, would show up at the output nodes, Vop and Von, making the difference ready for the latch 290 to regenerate during the regeneration phase. In other words, the gates of the first cross-coupled pair of transistors, Mn 202 and Mn 204, acquires the difference and the difference is used (directly) by first cross-coupled pair of transistors, Mn 202 and Mn 204 in the regeneration phase. In some conventional approaches, additional devices are used to acquire the signal, and those devices are not used in the regeneration phase. Thus, those conventional approaches cannot benefit from having the difference being available at the gate of the transistor devices. By keeping the latch 290 "alive" with Mn_tail 216, the latch is "ready to go" when the latch 290 transitions to regeneration phase, and can operate faster than conventional approaches that do not keep any current in the latch before regeneration phase.

Figure 4:
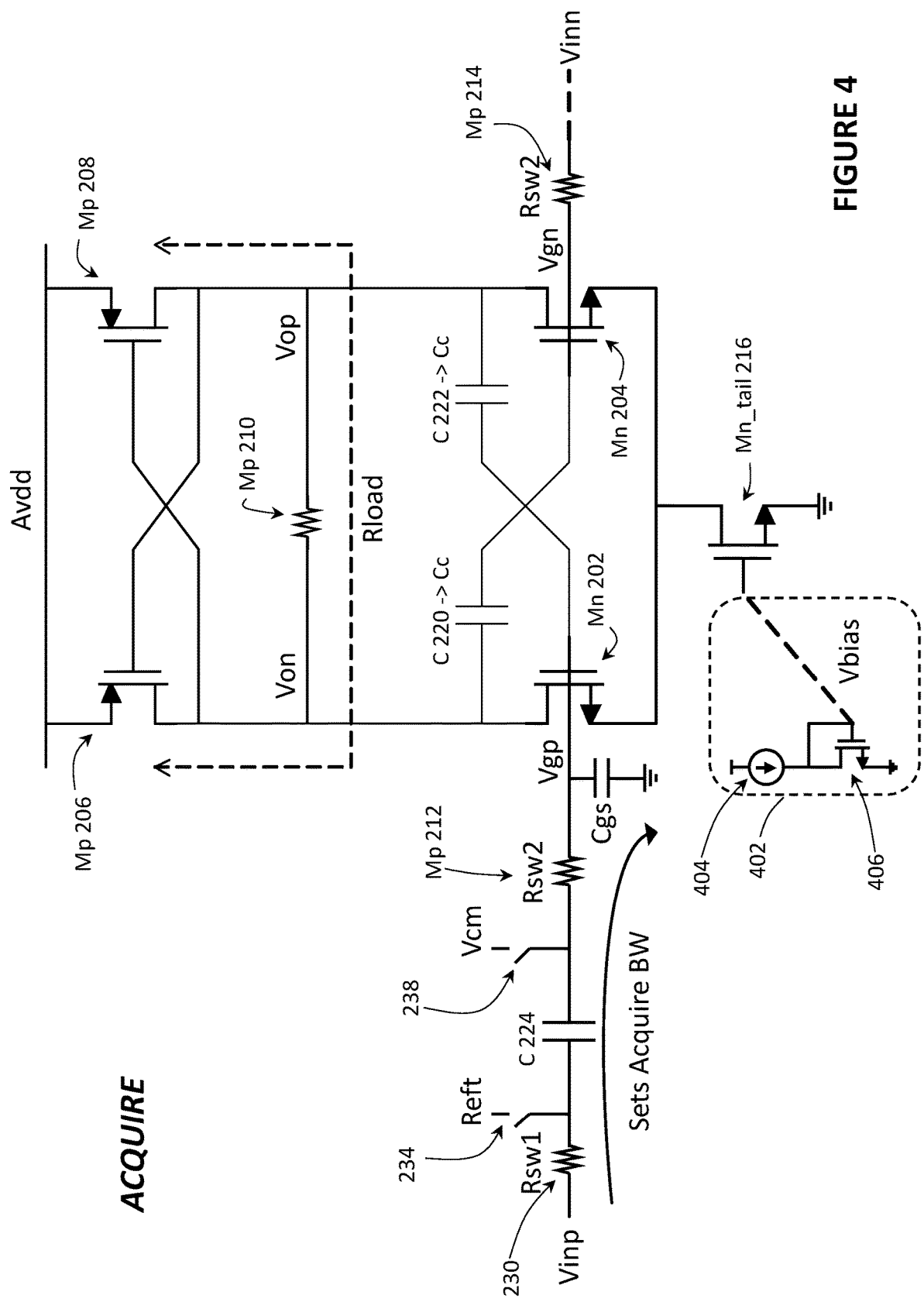
FIG. 4 shows a circuit equivalent to the circuit implementation in FIG. 2 during an acquire phase, according to some embodiments of the disclosure.

FIG. 4 shows a circuit equivalent to the circuit implementation in FIG. 2 during an acquire phase, according to some embodiments of the disclosure. Input switches 230 and 232 are closed, and behave like resistors (e.g., input switch 230 is shown as Rsw1, which is an on-resistance of input switch 230). Isolation switches, Mp 212 and Mp 214, are closed, and behave like resistors (e.g., Isolation switches, Mp 212 and Mp 214, are shown as Rsw2, which is an on-resistance of isolation switch Mp 212 or isolation switch Mp 214). The first cross-coupled pair of transistors, Mn 202 and Mn 204, and the tail current transistor, Mn_tail 216, form a differential amplifier. C 220 and C 224 are bootstrapped out with a nominal gain of 1. The difference generated from the sampling network 280 is (effectively) sampled onto and acquired by the gates of the first cross-coupled pair of transistors, Mn 202 and Mn 204, and the difference amplified by the differential amplifier. The differential amplifier sets seed voltage for the second cross-coupled pair of transistors, Mp 206 and Mp 208. Latching switch, Mp 210, is closed, and behave like a resistor. The latching switch, Mp 210, and the second cross-coupled pair of transistors, Mp 206 and Mp 208, together behave as a load, shown as Rload.

The bandwidth (BW) of the acquire phase is thus set by a resistor-capacitor network. As seen in the FIGURE, the resistor-capacitor network includes Rsw1, C 224, Rsw2, Cc (due to the level-shifting capacitor C 220 or C 222) and Cgs (e.g., gate-to-source capacitance of Mn 202, or Mn 204). The resistor-capacitor network can provide very high signal BW (especially when compared against conventional implementations where the different would be sampled through a separate pre-amplifier or a transconductance stage), making the comparator 200 highly desirable for applications requiring high acquire BW or very short acquire time. The high acquire BW is a direct result of being able to sample and acquire the difference at the gates of the first cross-coupled pair of transistors, Mn 202 and Mn 204.

Regeneration Phase

Referring to the comparator 200 in FIG. 2 and timing diagram seen in FIG. 3, during regeneration phase:

Qinput is "low", which means that input switches 230 and 232 are open.

Qlatch is "high", which means that isolation switches, Mp 212 and Mp 214, and latching switch Mp 210 are open (switches are implemented with PMOS transistors).

Qlatch2 is "high" to make the tail current transistor Mn_tail 216 fully "on".

Qbias is "high", which means that common mode switches 238 and 240 are closed.

Qref is "high", which means that the reference switches 234 and 236 are closed.

During the regeneration phase, the latch 290 latches the difference and regenerates to output a latched comparator result at the output nodes Vop, and Von. The tail current transistor, Mn_tail 216 is turned fully "on" to pull the Mn_tail 216, to ground to provide maximum headroom for the latch.

Control signal Qlatch transitions from "low" to "high" to kick off regeneration in the latch 290. When Qlatch transitions from "low" to "high", the latching switch Mp 210 opens to release the latch 290 and the isolation switches, Mp 212 and Mp 214, open. Opening latching switch, Mp 210, lets the difference at the gates of the first cross-coupled pair of transistors, Mp 212 and Mp 214, regenerate in the latch 290. At the beginning of the regeneration phase, the difference is captured at the gates of the first cross-coupled pair of transistors, Mp 212 and Mp 214, and on the level-shifting capacitors, C 220 and C 222. During regeneration phase, the first cross-coupled pair of transistors, Mp 212 and Mp 214, and the second cross-coupled pair of transistors, Mp 206 and Mp 208, form a cross-coupled inverter with level-shifting capacitors, C 220 and C 222. Because the difference is captured on C 220 and C 222, and C 220 and C 222 decouple the NMOS and PMOS transistor devices, the latch can regenerate quickly. At the end of regeneration, no static current is burned through the latch 290. When the latch makes a decision and generates a latched comparison result at the output nodes, Vop and Von, one of the NMOS transistor and one of the PMOS transistor would be turned off.

The sampling network 280 can sample the reference onto capacitors C 224 and C 226 (same in the reset phase), while the isolation switches, Mp 212 and Mp 214, are opened to isolate the sampling network 280 from the regeneration occurring in latch 290.

Figure 5:
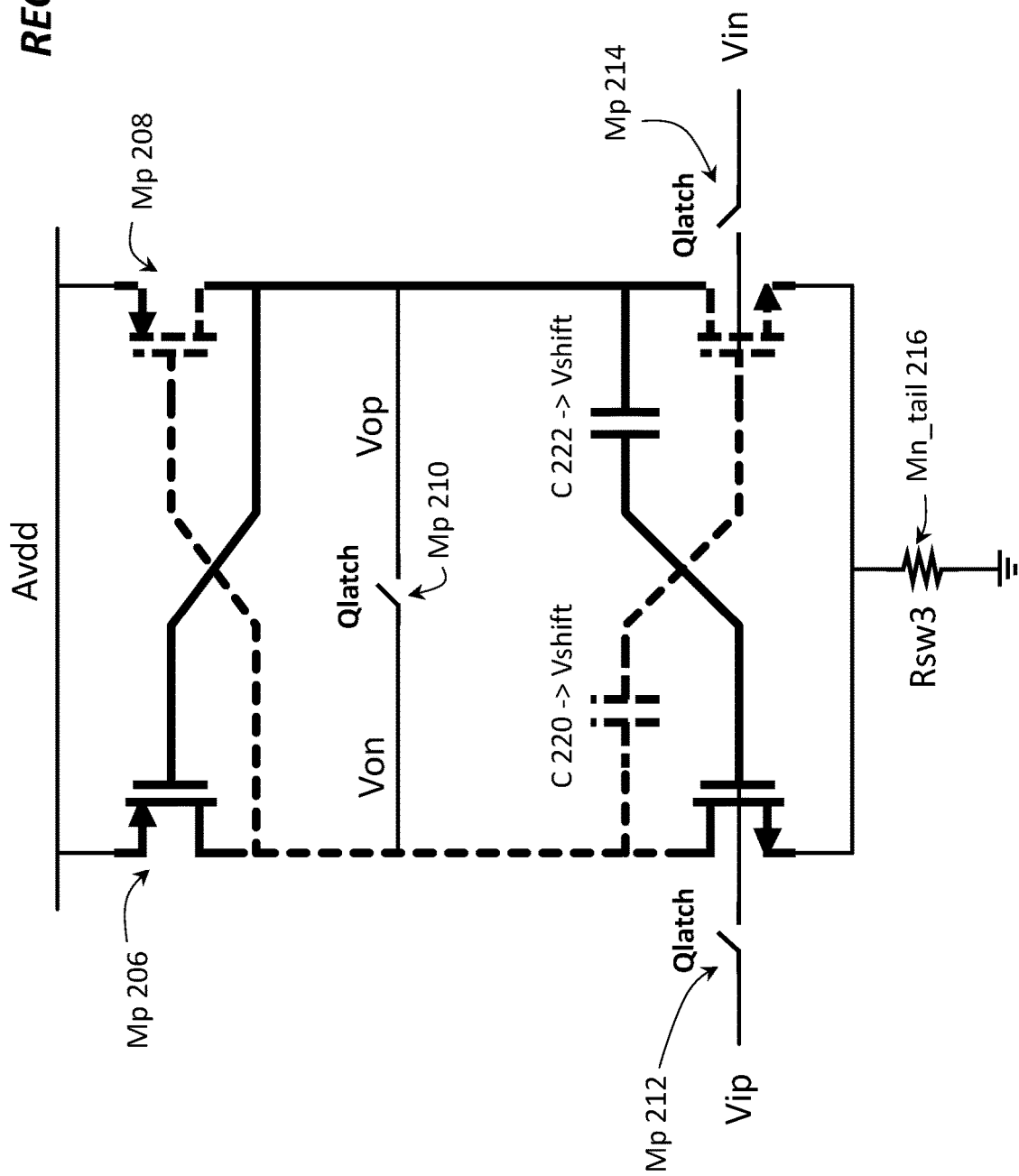
FIG. 5 shows a circuit equivalent to the circuit implementation in FIG. 2 during a regeneration phase, according to some embodiments of the disclosure.

FIG. 5 shows a circuit equivalent to the circuit implementation in FIG. 2 during a regeneration phase, according to some embodiments of the disclosure. The sampling network 280 is omitted from the FIGURE for simplicity. When the tail current transistor Mn_tail 216 is turned fully "on", it behaves like a resistor (shown as Rsw3, which an on-resistance of the Mn_tail 216). There can be a small voltage drop across Mn_tail 216.

The first cross-coupled pair of transistors, Mp 212 and Mp 214, and the second cross-coupled pair of transistors, Mp 206 and Mp 208, operate with positive feedback, and output a latched comparison result at the output nodes, Vop and Von.

Note that level-shifting capacitors, C 220 and C 222, decouple the gate-to-source voltage of the PMOS devices and the gate-to-source voltage of the NMOS devices and provide a voltage shift Vshift. For various reasons described herein, the result is a latch 290 with faster regeneration time and less propagation delay.

Implementation of the Comparator Using Complementary Transistor Devices

Figure 6:
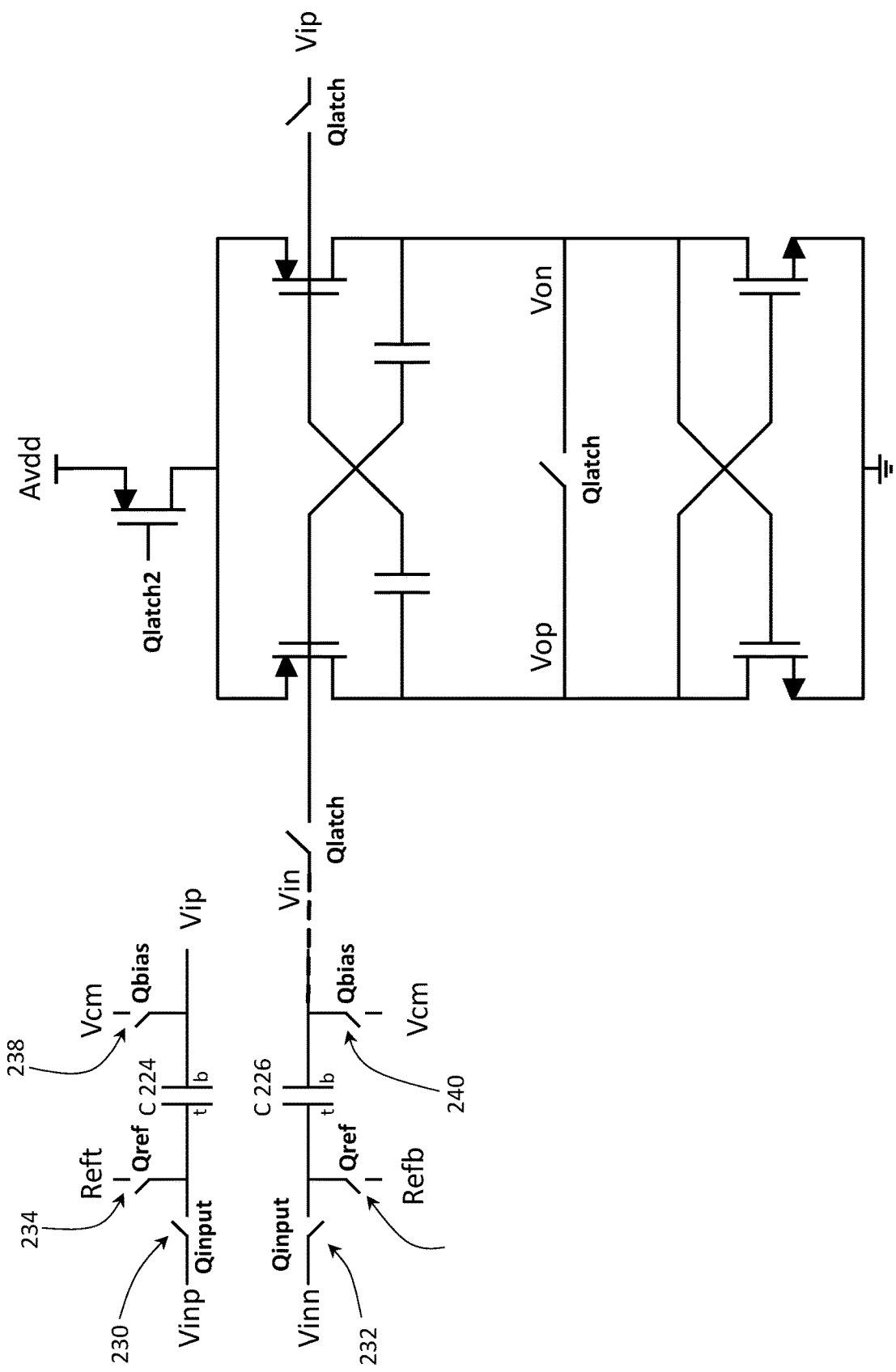
FIG. 6 shows an alternative circuit implementation of the comparator, according to some embodiments of the disclosure.

FIG. 6 shows an alternative circuit implementation of the comparator, according to some embodiments of the disclosure. The FIGURE illustrates that the first cross-coupled pair of transistors, Mp 212 and Mp 214, and the tail current transistor Mn_tail 216 can be implemented using PMOS transistors instead of NMOS transistors. Also, the second cross-coupled pair of transistors, Mp 206 and Mp 208, can be implemented using NMOS transistors instead of PMOS transistors. The circuit topology illustrated in FIG. 6 is effectively an up-side down version of FIG. 2.

Controlling a Current of the Tail Current Transistor

Referring back to FIG. 4, a replica bias branch 402 is provided to bias the tail current transistor, Mn_tail 216, during reset and acquire phases. In some embodiments, the replica bias branch 402 can be coupled to and decoupled from the gate of the tail current transistor, Mn_tail 216, via a switch (not shown). In some embodiments, the replica bias branch 402 includes a (programmable) current source 404, and a diode connected transistor 406. A gate of the diode connected transistor 406 can be coupled to the gate of the tail current transistor, Mn_tail 216. The replica bias branch 402 generates a gate voltage to drive the tail current transistor, Mn_tail 216, and set the current going through tail current transistor, Mn_tail 216.

As discussed previously, the tail current transistor, Mn_tail 216 allows the current to be set/controlled during reset and acquire phases. The tail current transistor, Mn_tail 216, is biased to be fully "on" during regeneration phase. Two control signals, Vbias and "high" and one or more additional switches for coupling the control signals to the gate of Mn_tail 216, may be needed to control the tail current transistor, Mn_tail 216, during the three phases of operation.

Figure 7:
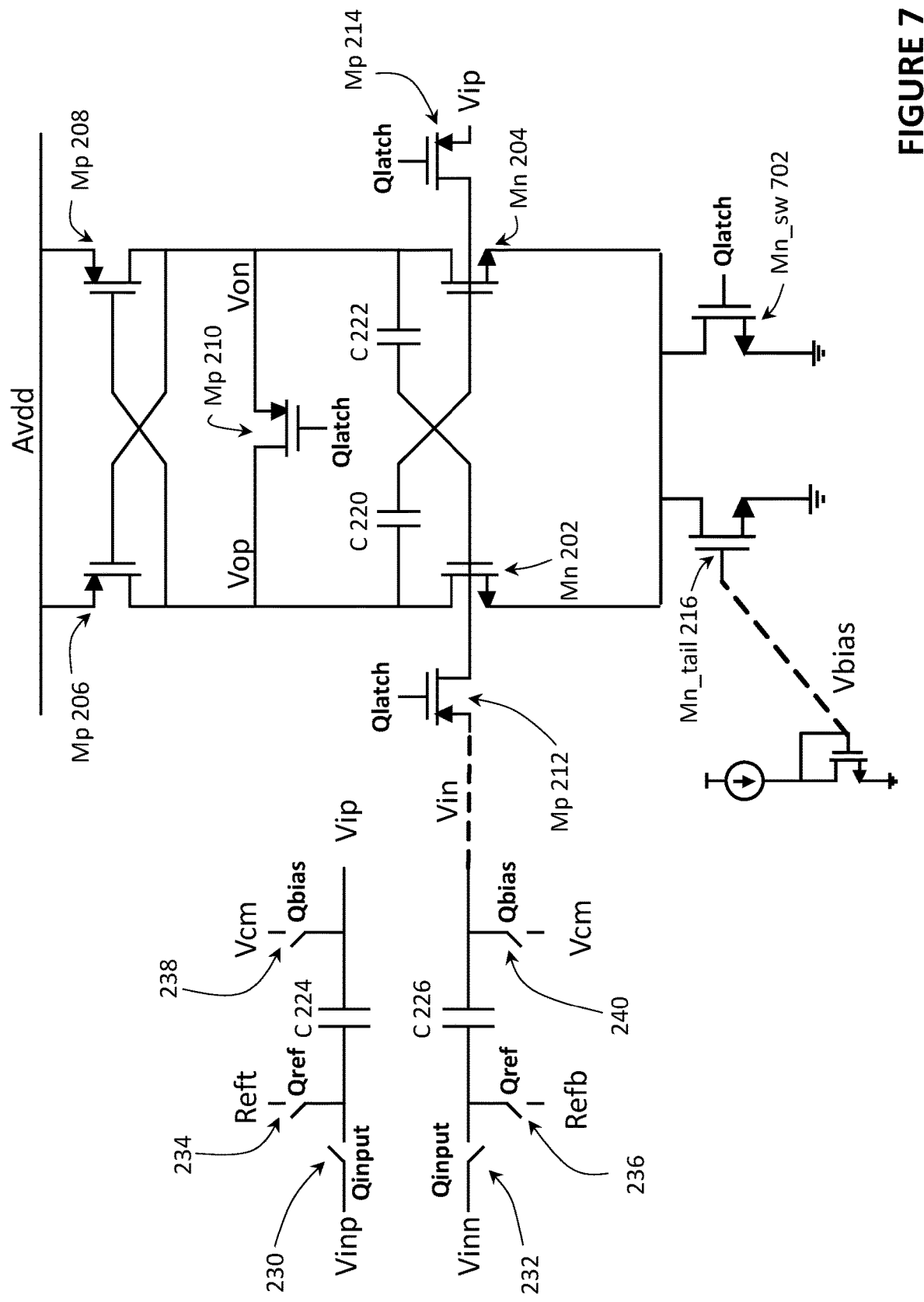
FIG. 7 shows another alternative circuit implementation of the comparator, according to some embodiments of the disclosure.

Instead of having a tail current transistor, Mn_tail 216, as seen in FIG. 4, it is possible to set the current in the latch 290 through the three phases using two transistor devices controlled by different control signals instead. FIG. 7 shows another alternative circuit implementation of the comparator, according to some embodiments of the disclosure. The switches can be controlled according to the timing diagram shown in FIG. 3. The latch includes the tail current transistor, Mn_tail 216, and a replica bias branch 402 as shown previously in FIG. 4. The replica bias branch 402 is coupled to the gate of tail current transistor, Mn_tail 216. The tail current transistor, Mn_tail 216, is biased by the replica bias branch 402, e.g., to set a current in the latch during reset and acquire phases. In addition, the latch includes an additional transistor, Mn_sw 702, coupled to second terminals (e.g., sources) of the first cross-coupled pair of transistors, Mn 202, and Mn 204, wherein the transistor is biased to turn fully "on" by control signal Qlatch during a regeneration phase of the latch. Mn_sw 702 is in parallel to Mn_tail 216. Mn_sw 702 is shown as an NMOS transistor. However, the switching functionality of the additional switch illustrated herein can also be implemented with a PMOS transistor or a transmission gate, and a suitable control signal to drive the PMOS transistor or the transmission gate.

This configuration allows just one control signal Qlatch to be used, at the (small) cost of an additional transistor device. During reset and acquire phase, the tail current transistor, Mn_tail 216, acts as a current source, while the additional transistor, Mn_sw 702, is "off" (Qlatch is "low"). During regeneration phase, the additional transistor, Mn_sw 702, is fully "on" (Qlatch is "high"), pulling the node at the second terminals (e.g., sources) of the first cross-coupled pair of transistors, Mn 202, and Mn 204, to ground and the tail current transistor has no effect on the latch.

Reset Switch for Harder Reset

Figure 8:
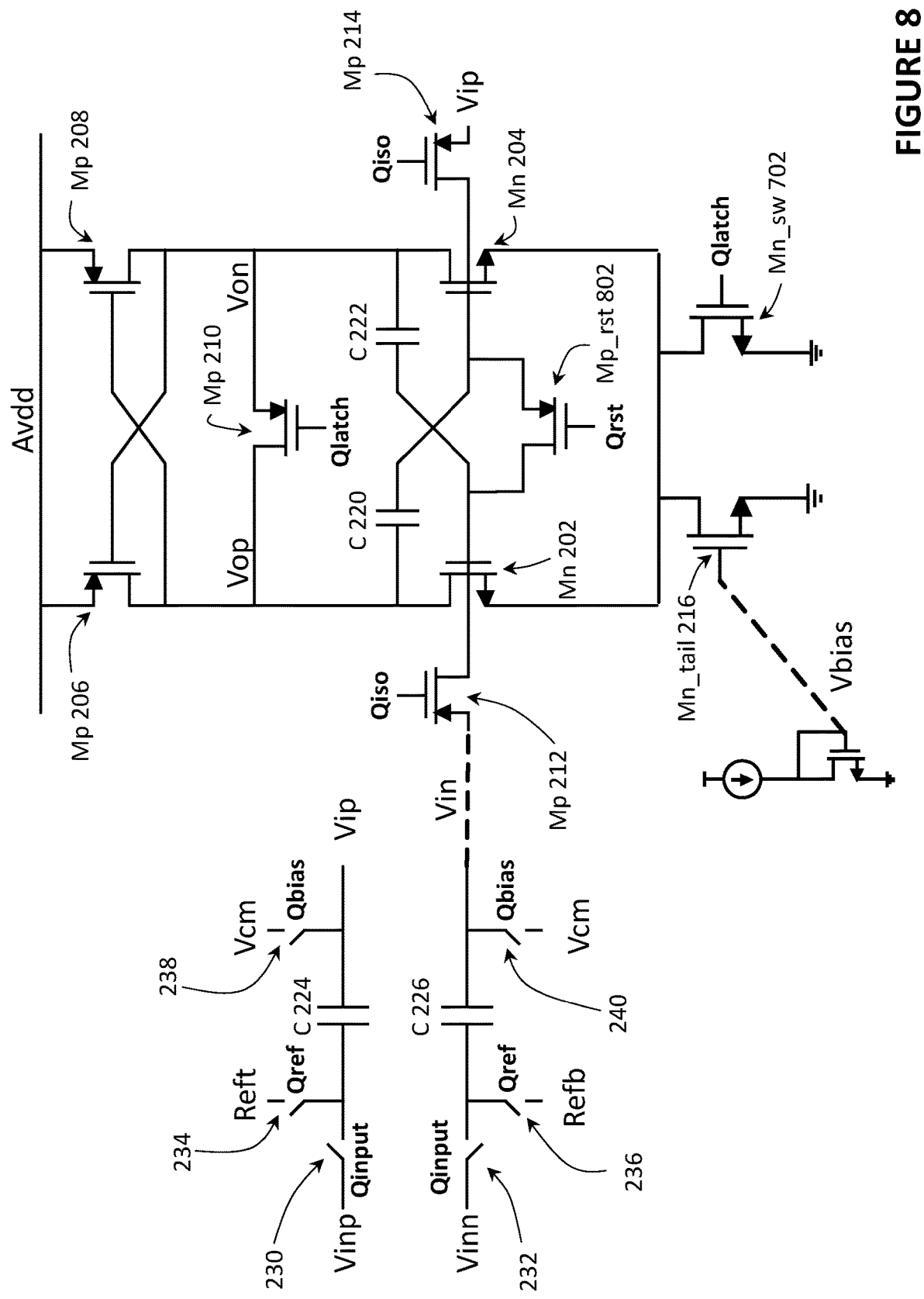
FIG. 8 illustrates an exemplary reset switch in the circuit implementation in FIG. 2, according to some embodiments of the disclosure.
Figure 9:
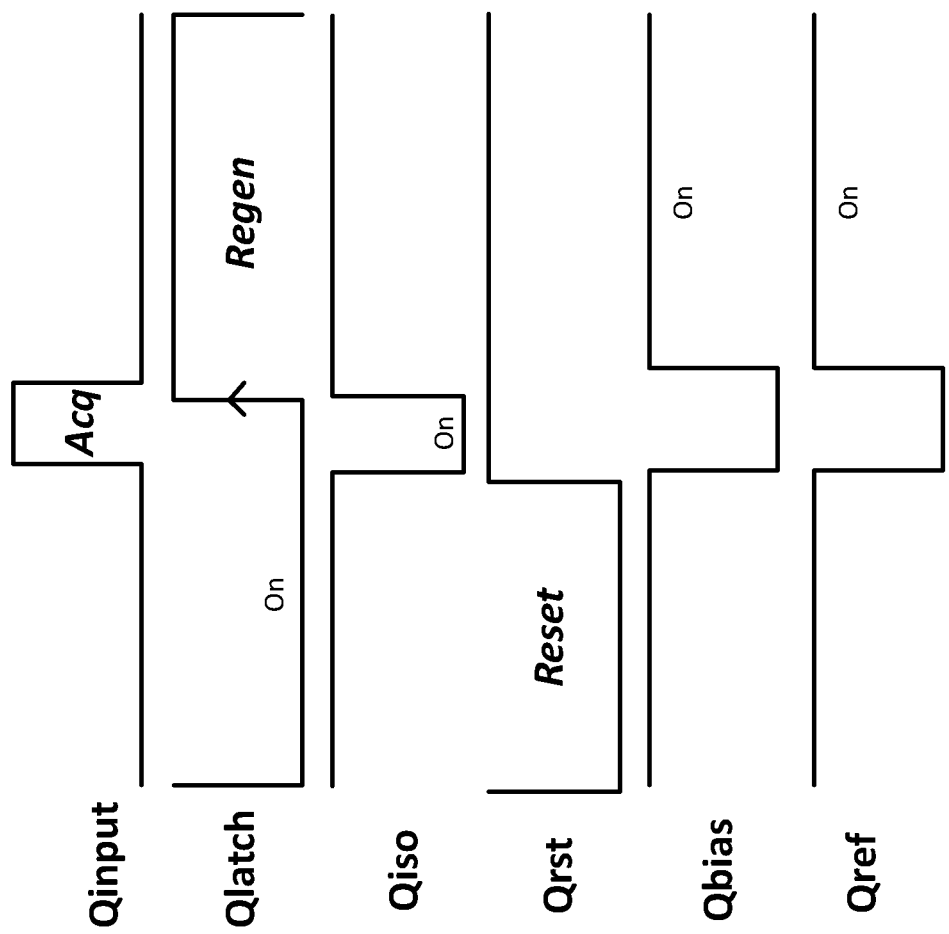
FIG. 9 shows an exemplary timing diagram of control signals controlling switches seen in FIG. 8, according to some embodiments of the disclosure.

FIG. 8 illustrates an exemplary reset switch in the circuit implementation in FIG. 2, according to some embodiments of the disclosure. FIG. 9 shows an exemplary timing diagram of control signals controlling switches seen in FIG. 8, according to some embodiments of the disclosure. FIG. 8 is similar to embodiments illustrated by FIGS. 2, and 4-7, with the some notable exceptions.

There is a reset switch, Mp_rst 802, which is controlled by control signal Qrst. Mp_rst 802 is across the gates of the first cross-coupled pair of transistors, Mn 202 and Mn 204.

Mp_rst 802 is shown as a PMOS transistor. However, the switching functionality of the reset switch can also be implemented with an NMOS transistor or transmission gate, and a suitable control signal to drive the NMOS transistor, and transmission gate. An additional control signal Qiso is provided to control the isolation switches Mp 212 and Mp 214 (e.g., implemented as PMOS transistors). The control signal Qiso is "low" to open the isolation switches, Mp 212 and Mp 214, during reset and regeneration phases, and the control signal Qiso is "high" to close the isolation switches, Mp 212 and Mp 214, during acquire phase.

During reset phase, control signal Qrst is "low" to close the reset switch, Mp_rst 802, and connect gates of the first cross-coupled pair of transistors, Mn 202 and Mn 204, together. Qlatch is "on" to connect the output nodes, Vop and Von, together, as well. Accordingly, the reset switch, Mp_rst 802 can provide a harder reset of the output nodes, Vop and Von, and capacitors, C 220 and C 222, to a common mode voltage (which can be different from Vcm).

During acquire and regeneration phases, control signal Qrst is "high" to open the reset switch, Mp_rst 802, is open to allow the operations of the acquire and regeneration phases to occur.

Alternative Latching Switches

Figure 10:
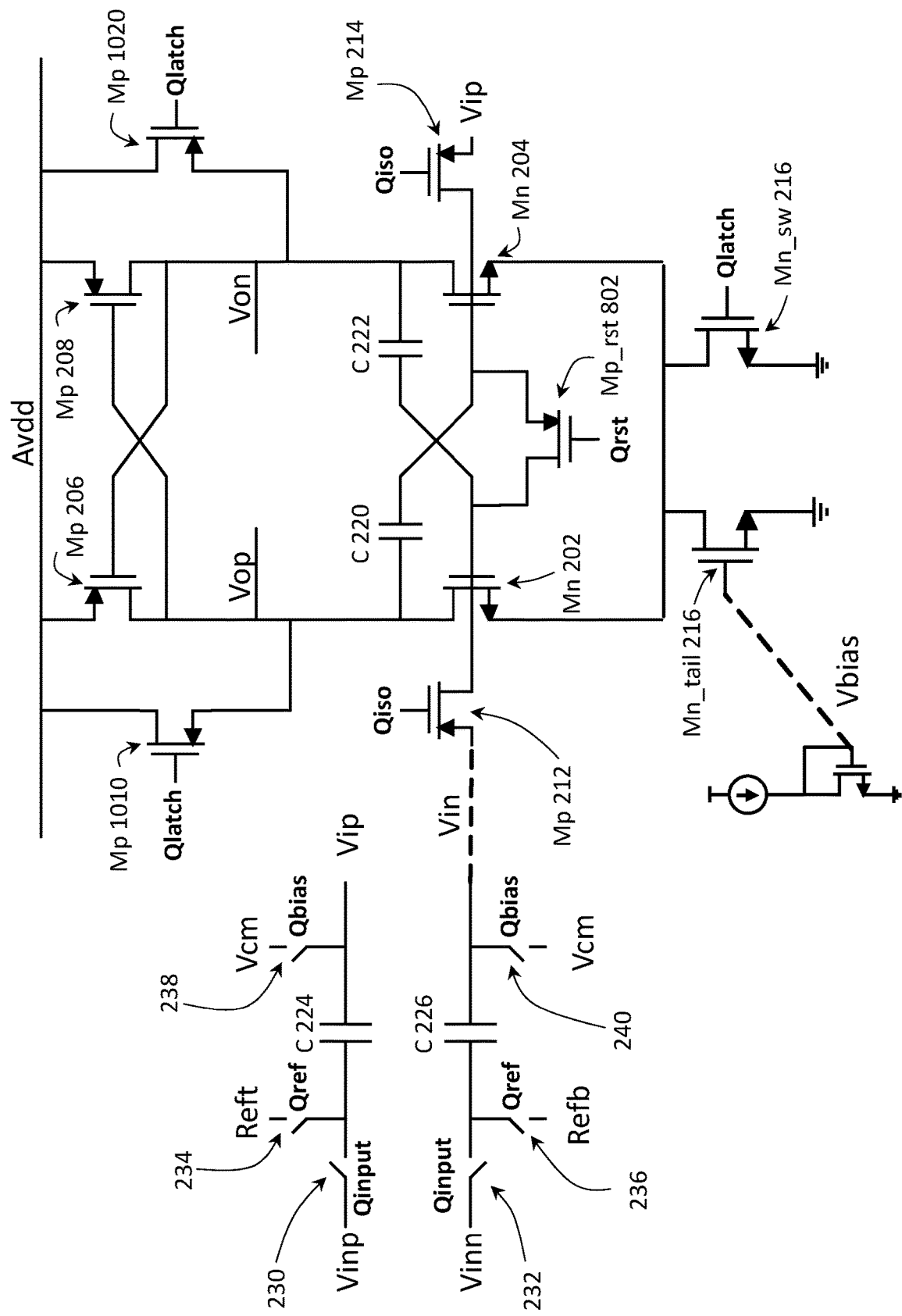
FIG. 10 shows yet another alternative circuit implementation of the comparator, according to some embodiments of the disclosure.

FIG. 10 shows yet another alternative circuit implementation of the comparator, according to some embodiments of the disclosure. FIG. 10 is similar to embodiments illustrated by FIGS. 2, and 4-7, with the exception that the latch has a first latching switch, Mp 1010, coupled across a first one of the output nodes (e.g., Vop) and a supply (e.g., Avdd), and a second latching switch, Mp 1020, coupled across a second one of the output nodes (e.g., Von) and the supply (e.g., Avdd). Mp 1010 and Mp 1020 are shown as a PMOS transistor. However, the switching functionality of the latching switches can also be implemented with NMOS transistors or transmission gates, and a suitable control signal to drive the NMOS transistors or the transmission gates. Mp 1010 and Mp 1020 are controlled by control signal Qlatch, where the first and second latching switches, Mp 1010 and Mp 1020, are biased to turn on during a reset phase and an acquire phase of the latch, and turn off during a regeneration phase of the latch.

A Method for Performing a Latched Comparison

Figure 11:
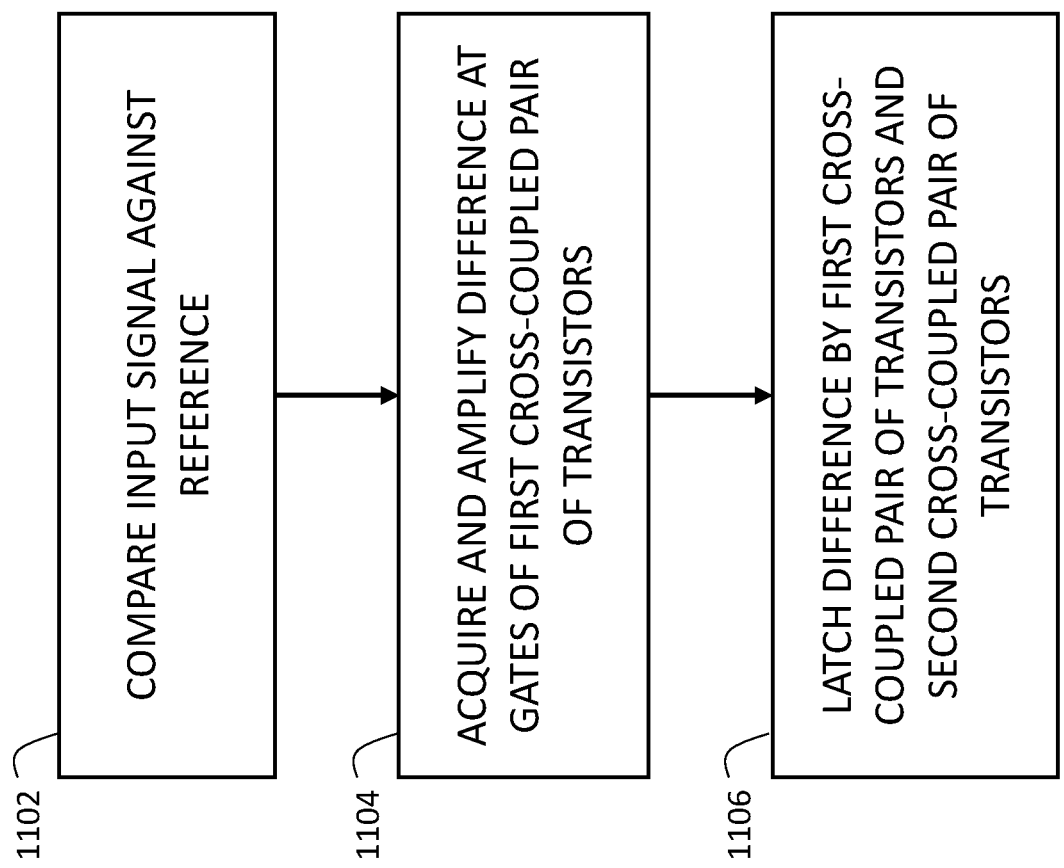
FIG. 11 is a flow diagram illustrating a method implementable by a comparator circuit, according to some embodiments of the disclosure.

FIG. 11 is a flow diagram illustrating a method implementable by a comparator circuit, according to some embodiments of the disclosure. The method is for performing a latched comparison. In 1102, a sampling network can compare an input signal against a reference to generate a difference. In 1104, a latch can acquire and amplify the difference driving gates of a first cross-coupled pair of transistors in the latch. In 1106, the first cross-coupled pair of transistors and second cross-coupled pair of transistors of the latch can latch the difference.

In some embodiments, comparing the input signal against the reference comprises sampling the reference onto capacitors of the sampling network, and connecting the capacitors to the input to derive the difference.

In some embodiments, acquiring and amplifying the difference comprises setting a current through the first cross-coupled pair of transistors using a tail current transistor connected to sources of the first cross-coupled pair of transistors in the latch.

In some embodiments, latching the difference comprises decoupling, using level-shifting capacitors gate-to-source voltage of the first cross-coupled pair of transistors and gate-to-source voltage of the second cross-coupled pair of transistors.

In some embodiments, the method further includes resetting by connecting gates of the first cross-coupled pair of transistors to a common mode voltage, and connecting drains of the first cross-coupled pair of transistors together.

In some embodiments, the method further includes connecting gates of the first cross-coupled pair of transistors together; and connecting drains of the first cross-coupled pair of transistors together.

EXAMPLES

Example 1 is a low power and high bandwidth comparator, comprising: a sampling network to derive a difference between an input signal and a reference; a latch comprising a first cross-coupled pair of transistors and output nodes at respective first terminals of the first cross-coupled pair of transistors, wherein the first cross-coupled pair of transistors have gates which are directly driven by the difference, and the gates are cross-coupled to the output nodes.

In Example 2, the low power and high bandwidth comparator of Example 1 can optionally include the gates of the first cross-coupled pair of transistors being cross-coupled to the output nodes via respective level-shifting capacitors.

In Example 3, the low power and high bandwidth comparator of Example 1 or 2 can optionally include the latch further comprising: a second cross-coupled pair of transistors having first terminals at the respective output nodes and gates cross-coupled to the output nodes.

In Example 4, the low power and high bandwidth comparator of any one of Examples 1-3, further comprising: first and second transistors to couple the difference from the sampling network to the respective gates of the first cross-coupled pair of transistors.

In Example 5, the low power and high bandwidth comparator of any one of Examples 1-4, can optionally include the latch further comprising: a tail current transistor coupled to second terminals of the first cross-coupled pair of transistors, wherein the tail current transistor is biased to set a current in the latch during an acquire phase of the latch.

In Example 6, the low power and high bandwidth comparator of Example 5 can optionally include the latch further comprising: a replica bias branch to bias the tail current transistor.

In Example 7, the low power and high bandwidth comparator of any one of Examples 1-6 can optionally include the latch further comprising: a transistor coupled to second terminals of the first cross-coupled pair of transistors, wherein the transistor is biased to turn on during a regeneration phase of the latch.

In Example 8, the low power and high bandwidth comparator of any one of Examples 1-7 can optionally include the latch further comprising: a latching switch coupled across the output nodes, wherein the latching switch is biased to turn on during an acquire phase of the latch and turn off during a regeneration phase of the latch.

In Example 9, the low power and high bandwidth comparator of any one of Examples 1-8 can optionally include the latch further comprising: first latching switch coupled across a first one of the output nodes and a supply; and second latching switch coupled across a second one of the output nodes and the supply; wherein the first and second latching switches are biased to turn on during an acquire phase of the latch and turn off during a regeneration phase of the latch.

In Example 10, the low power and high bandwidth comparator of any one of Examples 1-9 can optionally include the latch further comprising: a reset switch coupled across the gates of the first cross-coupled pair of transistors, wherein the reset switch is biased to turn on during a reset phase of the latch.

In Example 11, the low power and high bandwidth comparator of any one of Examples 1-10 can optionally include the sampling network comprising switches and capacitors to sample the reference onto the capacitors, and connect the capacitors to the input to derive the difference.

Example 12 is a low power and high bandwidth comparator, comprising: a switched capacitor network to sample an input signal and derive a difference between the input signal and a reference; and a latch having an integrated pre-amplifier, latching circuitry, and output nodes, wherein the integrated pre-amplifier and the latching circuitry share the output nodes, and the difference drives the integrated pre-amplifier during an acquire phase of the latch.

In Example 13, the low power and high bandwidth comparator of Example 12 can optionally include the integrated pre-amplifier comprising: a first cross-coupled pair of transistors of a first type, and a tail current transistor coupled to second terminals of the first cross-coupled pair of transistors.

In Example 14, the low power and high bandwidth comparator of Example 13 can optionally include: the output nodes being at respective first terminals of the first cross-coupled pair of transistors; the difference driving gates of the first cross-coupled pair of transistors during the acquire phase of the latch; and the tail current transistor setting a current in the latch during the acquire phase of the latch.

In Example 15, the low power and high bandwidth comparator of Example 13 or 14 can optionally include: the first cross-coupled pair of transistors have gates which are cross-coupled to the output nodes via respective level-shifting capacitors.

In Example 16, the low power and high bandwidth comparator of any one of Examples 13-15 can optionally include the latching circuitry comprising: the first cross-coupled pair of transistors, a second cross-coupled pair of transistors of a second type different from the first type, and a latching switch coupled across the output nodes.

In Example 17, the low power and high bandwidth comparator of Example 16 can optionally include the output nodes being at respective first terminals of the second cross-coupled pair of transistors, and being cross-coupled to gates of the second cross-coupled pair of transistors.

Example 18 is a method for performing a latched comparison, comprising: comparing an input signal against a reference to generate a difference; acquiring and amplifying the difference driving gates of a first cross-coupled pair of transistors; latching the difference by the first cross-coupled pair of transistors and second cross-coupled pair of transistors.

In Example 19, the method of Example 18 can optionally include comparing the input signal against the reference comprises: sampling the reference onto capacitors; and connecting the capacitors to the input to derive the difference.

In Example 20, the method of Example 18 or 19 can optionally include acquiring and amplifying the difference comprising: setting a current through the first cross-coupled pair of transistors using a tail current transistor connected to sources of the first cross-coupled pair of transistors.

In Example 21, the method of any one of any one of Examples 18-20 can optionally include latching the difference comprising: decoupling, using level-shifting capacitors, gate-to-source voltage of the first cross-coupled pair of transistors and gate-to-source voltage of the second cross-coupled pair of transistors.

In Example 22, the method of any one of Examples 18-21 can optionally include: resetting by connecting gates of the first cross-coupled pair of transistors to a common mode voltage, and connecting drains of the first cross-coupled pair of transistors together.

In Example 23, the method of any one of Examples 18-21 can optionally include resetting by connecting gates of the first cross-coupled pair of transistors together, and connecting drains of the first cross-coupled pair of transistors together.

Variations and Implementations

A switch, used herein, refers to a transistor device operating as a switch, which can be turned on or off. When the switch is closed, the transistor device is biased to turn on (e.g., the transistor device is in a saturation region of operation). When the switch is closed, the transistor device is biased to turn off (e.g., the transistor device is in a cut-off region of operation). The state of the switch is controlled by a control signal. The control signal can be used to bias the transistor device to operate the transistor device in either the saturation region ("on" state) or in the cut-off region ("off" state).

In the discussions of the embodiments herein, the parts and components can readily be replaced, substituted, or otherwise modified in order to accommodate particular circuitry needs. Moreover, it should be noted that the use of complementary electronic devices, hardware, etc. offer an equally viable option for implementing the teachings of the present disclosure. For instance, complementary configurations using PMOS transistor(s) (p-type metal-oxide semiconductor transistor(s)) to replace NMOS transistor(s) (p-type metal-oxide semiconductor transistor(s)) or vice versa, are envisioned by the disclosure. For instance, the present disclosure/claims encompasses implementations where all NMOS devices are replaced by PMOS devices, or vice versa. Connections and the circuit can be reconfigured to achieve the same function. These implementations are equivalent to the disclosed implementations using complementary transistors devices because the implementations would perform substantially the same function in substantially the same way to yield substantially the same result. It is understood by one skilled in the art that a transistor device can be generalized as a device having three terminals. Furthermore, it is understood by one skilled in the art that a switch, a transistor, or transistor device, during operation, can have a characteristic behavior of transistors corresponding to devices such as NMOS, PMOS devices (and any other equivalent transistor devices).

Note that the activities discussed above with reference to the FIGURES are applicable to any integrated circuits that involve processing analog signals and converting the analog signals into digital data using one or more ADCs. The features can be particularly beneficial to high speed ADCs, where input frequencies are relatively high in the Gigahertz range. The ADC can be applicable to medical systems, scientific instrumentation, wireless and wired communications systems (especially systems requiring a high sampling rate), radar, industrial process control, audio and video equipment, instrumentation, and other systems which uses ADCs. The level of performance offered by high speed ADCs can be particularly beneficial to products and systems in demanding markets such as high speed communications, medical imaging, synthetic aperture radar, digital beamforming communication systems, broadband communication systems, high performance imaging, and advanced test/measurement systems (oscilloscopes).

The present disclosure encompasses apparatuses which can perform the various methods described herein. The apparatuses can include a suitable combination of means for implementing/carrying out any one of the methods described herein. Such apparatuses can include circuitry illustrated by the FIGURES and described herein. Parts of various apparatuses can include electronic circuitry to perform the functions described herein. The circuitry can operate in analog domain, digital domain, or in a mixed-signal domain.

It is also imperative to note that all of the specifications, dimensions, and relationships outlined herein (e.g., the number of processors, logic operations, etc.) have only been offered for purposes of example and teaching only. Such information may be varied considerably without departing from the spirit of the present disclosure, or the scope of the appended claims or examples described herein. The specifications apply only to one non-limiting example and, accordingly, they should be construed as such. In the foregoing description, example embodiments have been described with reference to particular processor and/or component arrangements. Various modifications and changes may be made to such embodiments without departing from the scope of the appended claims or examples described herein. The description and drawings are, accordingly, to be regarded in an illustrative rather than in a restrictive sense.

Note that with the numerous examples provided herein, interaction may be described in terms of two, three, four, or more electrical components or parts. However, this has been done for purposes of clarity and example only. It should be appreciated that the system can be consolidated in any suitable manner. Along similar design alternatives, any of the illustrated components, modules, blocks, and elements of the FIGURES may be combined in various possible configurations, all of which are clearly within the broad scope of this Specification. In certain cases, it may be easier to describe one or more of the functionalities of a given set of flows by only referencing a limited number of electrical elements. It should be appreciated that the electrical circuits of the FIGURES and its teachings are readily scalable and can accommodate a large number of components, as well as more complicated/sophisticated arrangements and configurations. Accordingly, the examples provided should not limit the scope or inhibit the broad teachings of the electrical circuits as potentially applied to a myriad of other architectures.

Note that in this Specification, references to various features (e.g., elements, structures, modules, components, steps, operations, characteristics, etc.) included in "one embodiment", "example embodiment", "an embodiment", "another embodiment", "some embodiments", "various embodiments", "other embodiments", "alternative embodiment", and the like are intended to mean that any such features are included in one or more embodiments of the present disclosure, but may or may not necessarily be combined in the same embodiments. It is also important to note that the functions described herein illustrate only some of the possible functions that may be executed by, or within, systems/circuits illustrated in the FIGURES. Some of these operations may be deleted or removed where appropriate, or these operations may be modified or changed considerably without departing from the scope of the present disclosure. In addition, the timing of these operations may be altered considerably. The preceding operational flows have been offered for purposes of example and discussion. Substantial flexibility is provided by embodiments described herein in that any suitable arrangements, chronologies, configurations, and timing mechanisms may be provided without departing from the teachings of the present disclosure. Numerous other changes, substitutions, variations, alterations, and modifications may be ascertained to one skilled in the art and it is intended that the present disclosure encompass all such changes, substitutions, variations, alterations, and modifications as falling within the scope of the appended claims or examples described herein. Note that all optional features of the apparatus described above may also be implemented with respect to the method or process described herein and specifics in the examples may be used anywhere in one or more embodiments.

What is claimed is:

1. A low power and high bandwidth comparator, comprising:
   a sampling network to derive a difference between an input signal and a reference;
   a latch comprising a first cross-coupled pair of transistors and output nodes at respective first terminals of the first cross-coupled pair of transistors, wherein gates of the first cross-coupled pair of transistors are cross-coupled to the output nodes; and
   first and second transistors to couple the difference from the sampling network to the gates of the first cross-coupled pair of transistors respectively.

2. The low power and high bandwidth comparator of claim 1, wherein the gates of the first cross-coupled pair of transistors are cross-coupled to the output nodes via respective level-shifting capacitors.

3. The low power and high bandwidth comparator of claim 1, wherein the latch further comprises:
   a second cross-coupled pair of transistors having first terminals at the respective output nodes and gates cross-coupled to the output nodes.

4. The low power and high bandwidth comparator of claim 1, wherein the latch further comprises:
   a tail current transistor coupled to second terminals of the first cross-coupled pair of transistors, wherein the tail current transistor is biased to set a current in the latch during an acquire phase of the latch.

5. The low power and high bandwidth comparator of claim 4, wherein the latch further comprises:
   a replica bias branch to bias the tail current transistor.

6. The low power and high bandwidth comparator of claim 1, wherein the latch further comprises:
   a transistor coupled to second terminals of the first cross-coupled pair of transistors, wherein the transistor is biased to turn on during a regeneration phase of the latch.

7. The low power and high bandwidth comparator of claim 1, wherein the latch further comprises:
   a latching switch coupled across the output nodes, wherein the latching switch is biased to turn on during an acquire phase of the latch and turn off during a regeneration phase of the latch.

8. The low power and high bandwidth comparator of claim 1, wherein the latch further comprises:
   a reset switch coupled across the gates of the first cross-coupled pair of transistors, wherein the reset switch is biased to turn on during a reset phase of the latch.

9. The low power and high bandwidth comparator of claim 1, wherein the sampling network comprises switches and capacitors to sample the reference onto the capacitors, and connect the capacitors to receive the input signal and derive the difference.

10. The low power and high bandwidth comparator of claim 1, wherein the latch further comprises:
   first latching switch coupled across a first one of the output nodes and a supply; and
   second latching switch coupled across a second one of the output nodes and the supply;
   wherein the first and second latching switches are biased to turn on during an acquire phase of the latch and turn off during a regeneration phase of the latch.

11. A low power and high bandwidth comparator, comprising:
   a switched capacitor network to sample an input signal and derive a difference between the input signal and a reference; and
   a latch having an integrated pre-amplifier, latching circuitry, and output nodes, wherein the integrated pre-amplifier and the latching circuitry share the output nodes, and the difference drives the integrated pre-amplifier during an acquire phase of the latch; wherein the integrated pre-amplifier comprises a first cross-coupled pair of transistors, and the first cross-coupled pair of transistors have gates which are cross-coupled to the output nodes via respective level-shifting capacitors.

12. The low power and high bandwidth comparator of claim 11, wherein:
   the integrated pre-amplifier comprises a tail current transistor coupled to second terminals of the first cross-coupled pair of transistors.

13. The low power and high bandwidth comparator of claim 12, wherein:
   the output nodes are at respective first terminals of the first cross-coupled pair of transistors;
   the difference drives gates of the first cross-coupled pair of transistors during the acquire phase of the latch; and
   the tail current transistor sets a current in the latch during the acquire phase of the latch.

14. The low power and high bandwidth comparator of claim 11, wherein:
   the latching circuitry comprises the first cross-coupled pair of transistors of a first type, a second cross-coupled pair of transistors of a second type different from the first type, and a latching switch coupled across the output nodes.

15. The low power and high bandwidth comparator of claim 14, wherein:
   the output nodes are at respective first terminals of the second cross-coupled pair of transistors, and are cross-coupled to gates of the second cross-coupled pair of transistors.

16. A method for performing a latched comparison, comprising:
   comparing an input signal against a reference to generate a difference;
   acquiring and amplifying the difference driving gates of a first cross-coupled pair of transistors using the difference, and setting a current through the first cross-coupled pair of transistors using a tail current transistor connected to sources of the first cross-coupled pair of transistors; and
   latching the difference by the first cross-coupled pair of transistors and second cross-coupled pair of transistors.

17. The method of claim 16, wherein comparing the input signal against the reference comprises:
   sampling the reference onto capacitors; and
   connecting the capacitors to sample the input signal and derive the difference.

18. The method of claim 16, wherein latching the difference comprises:
   decoupling, using level-shifting capacitors, gate-to-source voltage of the first cross-coupled pair of transistors and gate-to-source voltage of the second cross-coupled pair of transistors.

19. The method of claim 16, further comprising:
   resetting by connecting gates of the first cross-coupled pair of transistors to a common mode voltage, and connecting drains of the first cross-coupled pair of transistors together.

20. The method of claim 16, further comprising:
   resetting by connecting gates of the first cross-coupled pair of transistors together, and connecting drains of the first cross-coupled pair of transistors together.

* * * * *